(12) United States Patent
Ito et al.

(10) Patent No.: US 11,456,183 B2
(45) Date of Patent: Sep. 27, 2022

(54) PLASMA PROCESSING METHOD AND PLASMA ASHING APPARATUS

(71) Applicant: HITACHI HIGH-TECH CORPORATION, Tokyo (JP)

(72) Inventors: Toru Ito, Tokyo (JP); Masahito Mori, Tokyo (JP); Tadamitsu Kanekiyo, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/527,520

(22) Filed: Jul. 31, 2019

(65) Prior Publication Data
US 2020/0043744 A1 Feb. 6, 2020

(30) Foreign Application Priority Data
Aug. 6, 2018 (WO) .................. PCT/JP2018/029335

(51) Int. Cl.
*H01L 21/311* (2006.01)
*H01L 21/033* (2006.01)
(Continued)

(52) U.S. Cl.
CPC .. *H01L 21/31116* (2013.01); *H01J 37/32449* (2013.01); *H01J 37/32963* (2013.01); *H01L 21/0332* (2013.01); *H01L 21/31144* (2013.01); *H01L 21/67069* (2013.01); *H01L 22/26* (2013.01); *H01J 37/3211* (2013.01);
(Continued)

(58) Field of Classification Search
CPC ......... H01L 21/31116; H01L 21/31144; H01L 21/0332; H01L 22/26; H01L 21/67069; H01L 27/11556; H01L 27/11582; H01L 21/31122; H01L 21/3065; H01L 21/67213; H01J 37/32449; H01J 37/32963;
(Continued)

(56) References Cited

U.S. PATENT DOCUMENTS

2010/0330805 A1    12/2010  Doan et al.
2011/0136346 A1*    6/2011  Geissbuhler ...... H01L 21/67069
                                                      438/710
(Continued)

FOREIGN PATENT DOCUMENTS

JP    2009135478 A    6/2009
JP    2011228436 A   11/2011
(Continued)

OTHER PUBLICATIONS

Office Action dated Jun. 9, 2020 in Japanese Application No. 2019-110321.
(Continued)

*Primary Examiner* — Erin F Bergner
(74) *Attorney, Agent, or Firm* — Miles & Stockbridge P.C.

(57) ABSTRACT

Provided is a plasma processing method for selectively removing, after plasma etching using a mask having an amorphous carbon film containing boron, the amorphous carbon film using plasma from a silicon nitride film, a silicon oxide film or a tungsten film. The plasma processing method includes a removing step of removing the amorphous carbon film using plasma generated by mixed gas of $O_2$ gas and $CH_3F$ gas, or $CH_2F_2$ gas.

11 Claims, 9 Drawing Sheets

(51) Int. Cl.
- H01L 21/66 (2006.01)
- H01L 21/67 (2006.01)
- H01J 37/32 (2006.01)
- H01L 27/11556 (2017.01)
- H01L 27/11582 (2017.01)

(52) U.S. Cl.
CPC .......... *H01J 2237/24507* (2013.01); *H01J 2237/3341* (2013.01); *H01L 27/11556* (2013.01); *H01L 27/11582* (2013.01)

(58) Field of Classification Search
CPC ..... H01J 2237/24507; H01J 2237/3341; H01J 37/3211
See application file for complete search history.

(56) References Cited

U.S. PATENT DOCUMENTS

| | | | |
|---|---|---|---|
| 2011/0253672 A1 | 10/2011 | Kamibayashi et al. | |
| 2014/0225503 A1 | 8/2014 | Mori et al. | |
| 2014/0288726 A1* | 9/2014 | Miura | H01J 37/32522 700/299 |
| 2015/0064914 A1* | 3/2015 | Kong | H01L 21/0332 438/696 |
| 2015/0099366 A1 | 4/2015 | Takeda et al. | |
| 2015/0126035 A1* | 5/2015 | Diao | H01J 37/32357 438/710 |
| 2015/0221518 A1 | 8/2015 | Terakura et al. | |
| 2016/0005602 A1 | 1/2016 | Yoo et al. | |
| 2016/0240446 A1 | 8/2016 | Matsuda et al. | |
| 2016/0284610 A1 | 9/2016 | Usui et al. | |
| 2016/0293441 A1 | 10/2016 | Lee et al. | |
| 2017/0103893 A1 | 4/2017 | Kulshreshtha et al. | |
| 2018/0068862 A1* | 3/2018 | Terakura | H01L 21/0212 |
| 2018/0076048 A1 | 3/2018 | Gohira et al. | |
| 2018/0149809 A1 | 5/2018 | Tsuji | |
| 2018/0277377 A1 | 9/2018 | Eto et al. | |
| 2019/0067032 A1 | 2/2019 | Shinoda et al. | |

FOREIGN PATENT DOCUMENTS

| | | | |
|---|---|---|---|
| JP | 2014007370 A | 1/2014 | |
| JP | 2015144158 A | 8/2015 | |
| JP | 2016-517179 A | 6/2016 | |
| JP | 2016152313 A | 8/2016 | |
| JP | 2016184638 A | 10/2016 | |
| JP | 2018046185 A | 3/2018 | |
| JP | 2018088455 A | 6/2018 | |
| JP | 2019040932 A | 3/2019 | |
| KR | 20140090180 A | 7/2014 | |
| KR | 20150016498 A | 2/2015 | |
| KR | 20150107756 A | 9/2015 | |
| KR | 20170125009 A | 11/2017 | |
| TW | 201546897 A | 12/2015 | |
| TW | 201637093 A | 10/2016 | |
| TW | 201730962 A | 9/2017 | |
| TW | 201802931 A | 1/2018 | |
| TW | 201824341 A | 7/2018 | |
| TW | 201841189 A | 11/2018 | |
| WO | 2015069613 A1 | 5/2015 | |
| WO | WO-2017154407 A1 * | 9/2017 | .......... H01J 37/3244 |
| WO | 2018052494 A1 | 3/2018 | |

OTHER PUBLICATIONS

Office Action dated Mar. 11, 2020 in Tawainese Application No. 108125932.
Korean Office Action dated Aug. 27, 2018 for Application No. 10-2017-7020315 with Machine translation.
Korean Office Action dated Aug. 30, 2018 for Application No. 10-2018-7015807 with Machine translation.
Notice of Allowance dated Aug. 29, 2018 in U.S. Appl. No. 15/558,045.
Office Action dated Sep. 29, 2020 in Korean Application No. 10-2019-0084891.
Search Report dated Jul. 14, 2020 in International Application No. PCT/JP2020/023526.
Office Action dated Dec. 6, 2021 in Taiwanese Application No. 110121684.

* cited by examiner

[FIG. 1]
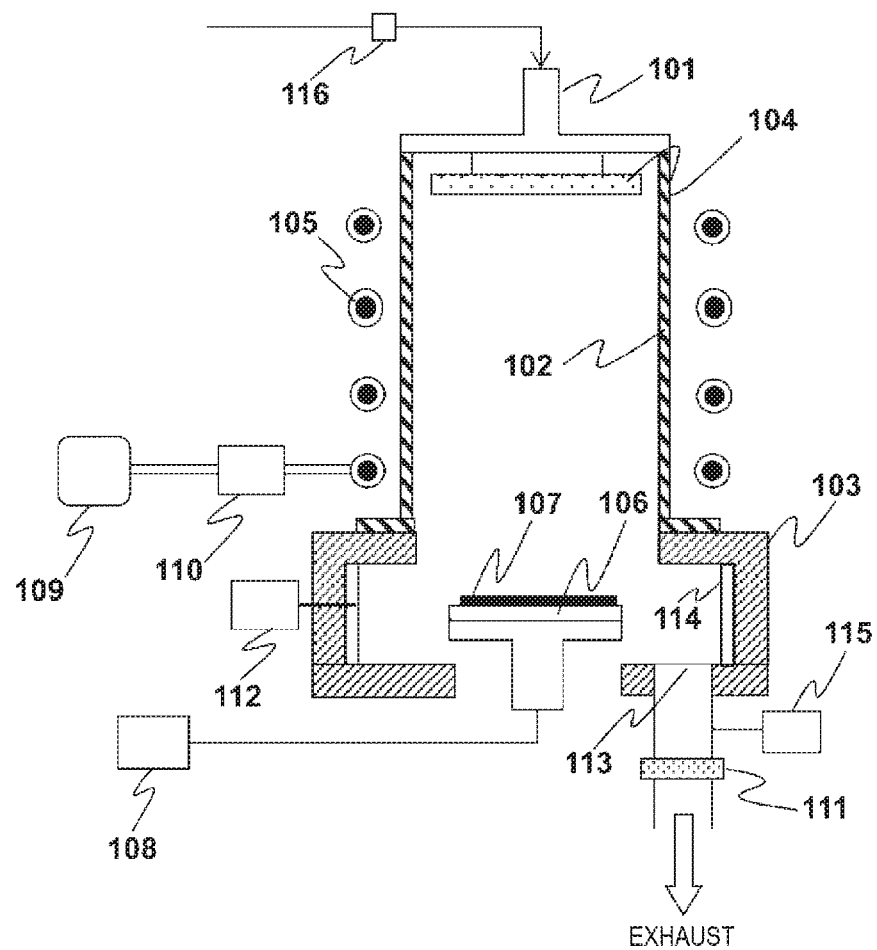

[FIG. 2A]
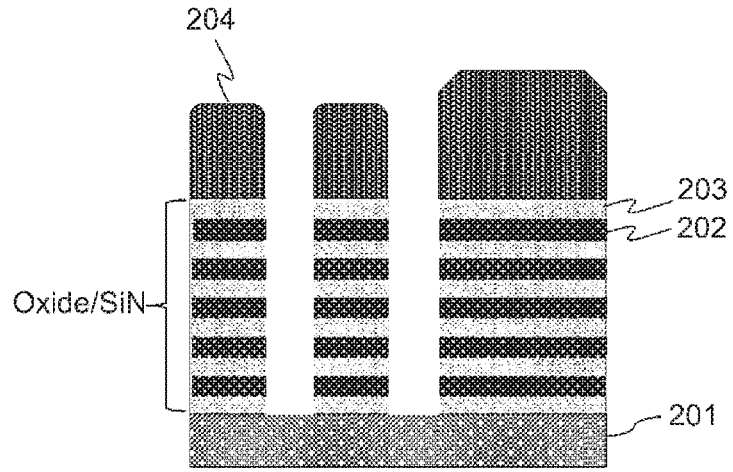
[FIG. 2B]
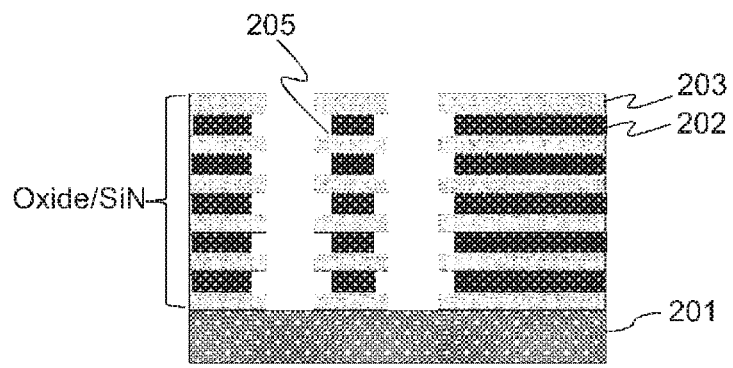
[FIG. 2C]
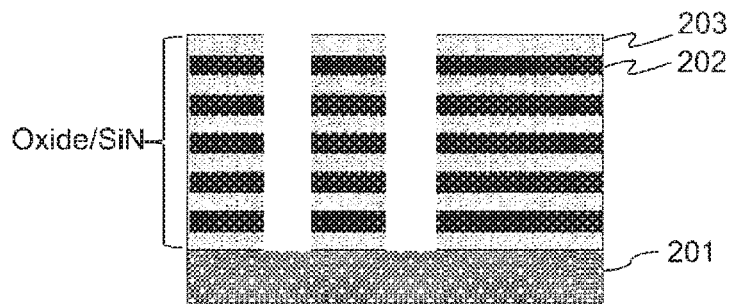

[FIG. 3]
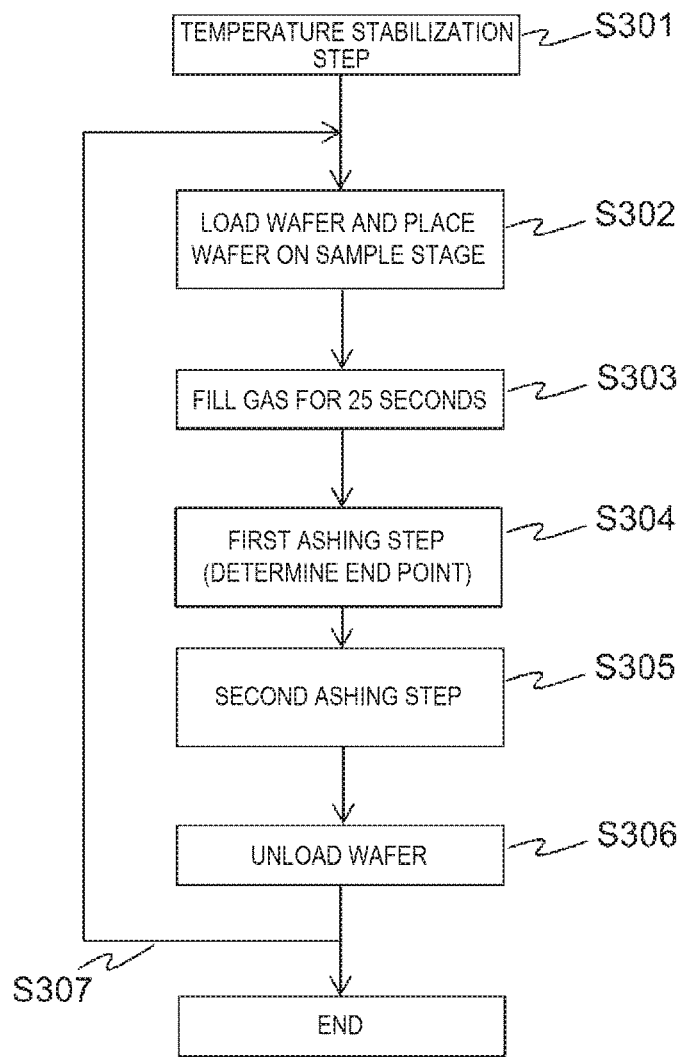

[FIG. 4A]
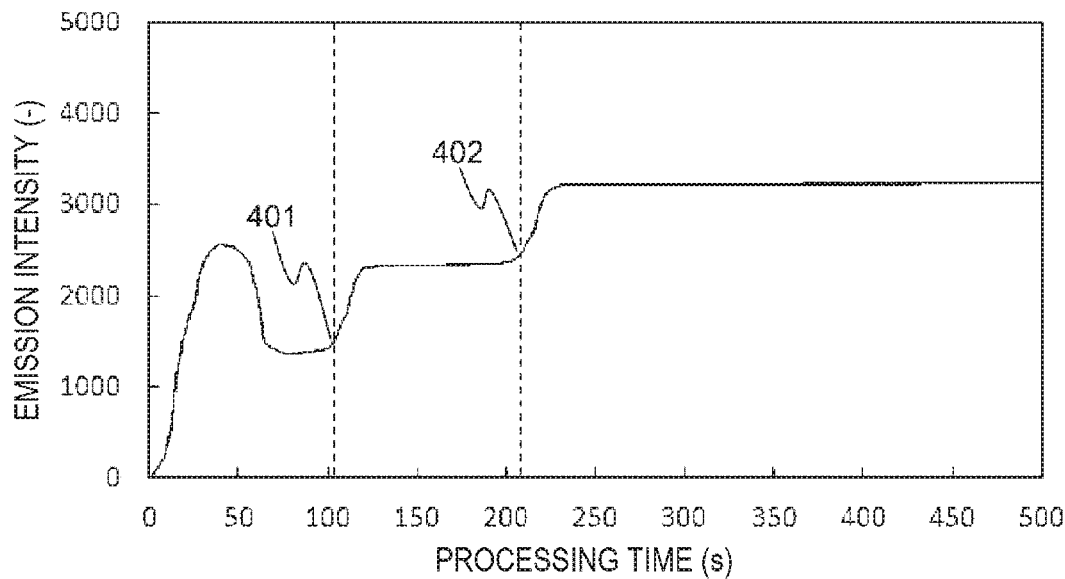
[FIG. 4B]
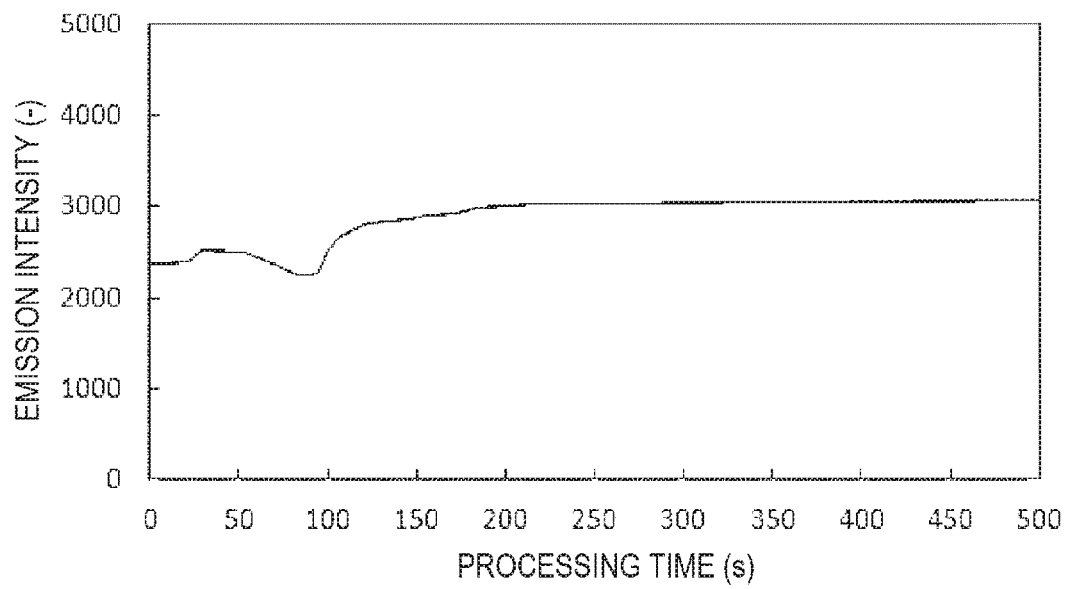

[FIG. 5]
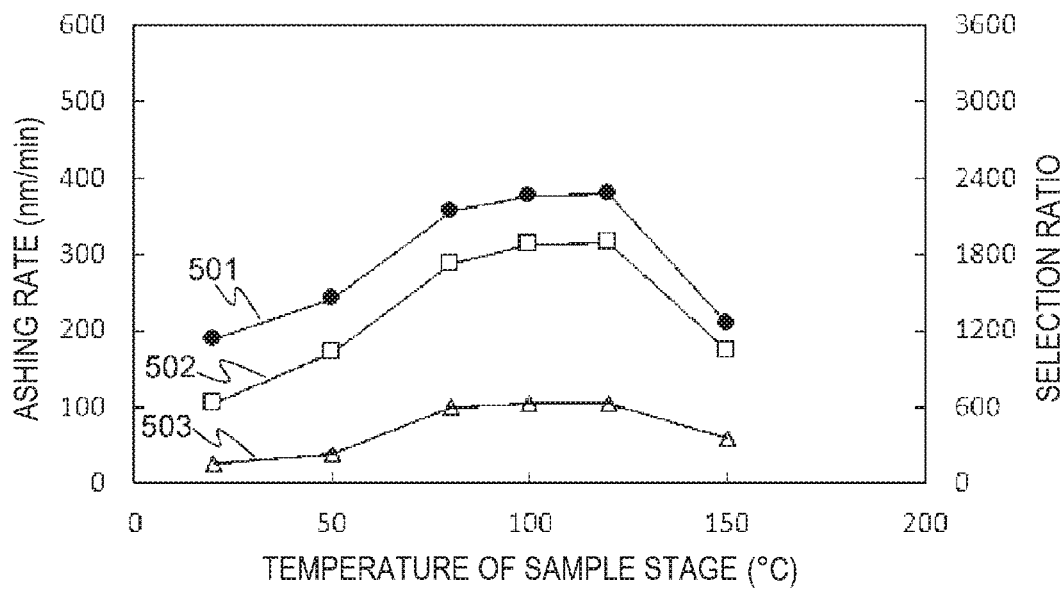
[FIG. 6]
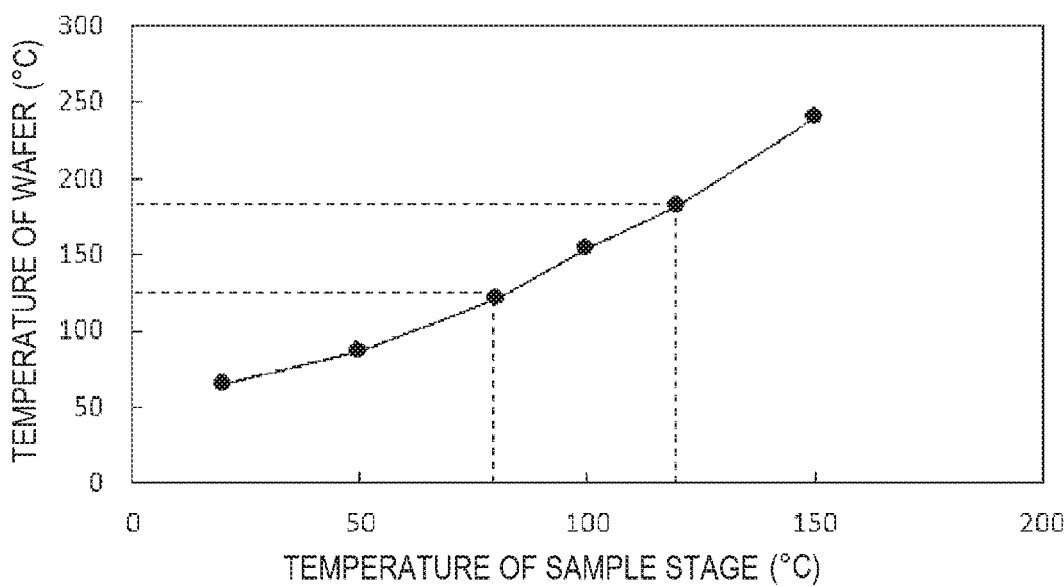

[FIG. 7]
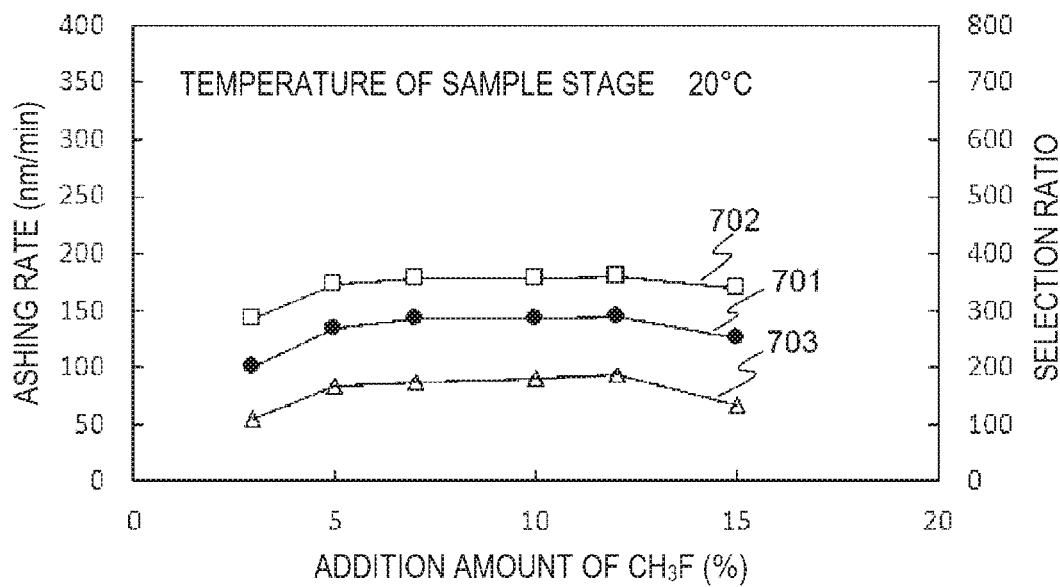
[FIG. 8]
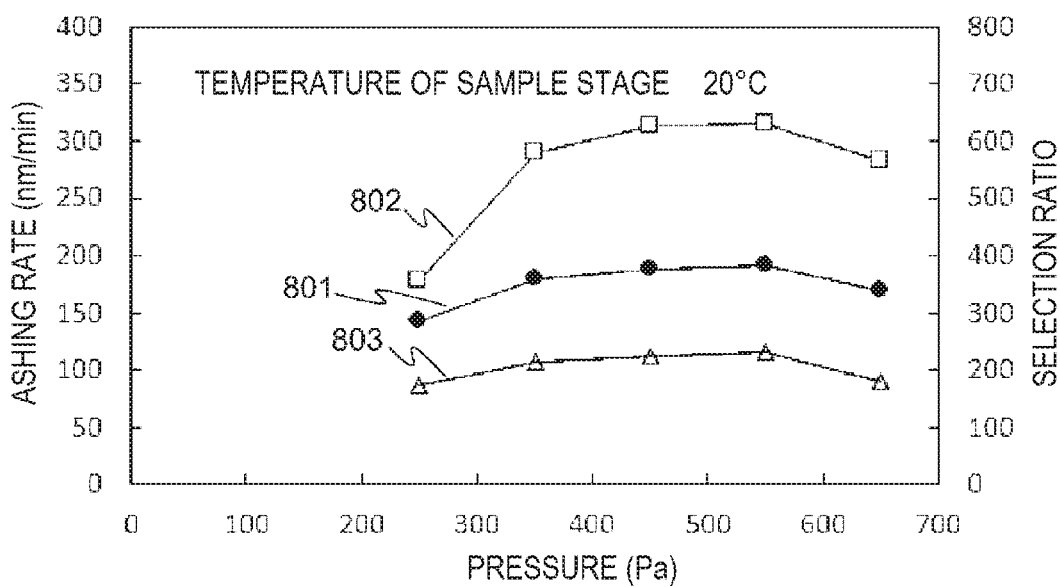

[FIG. 9]
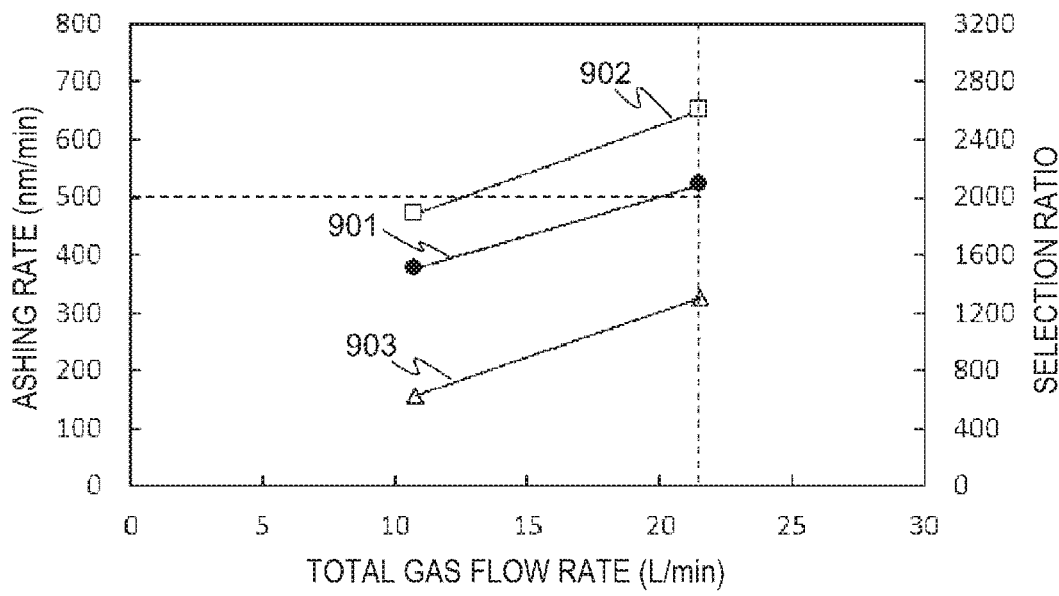
[FIG. 10]
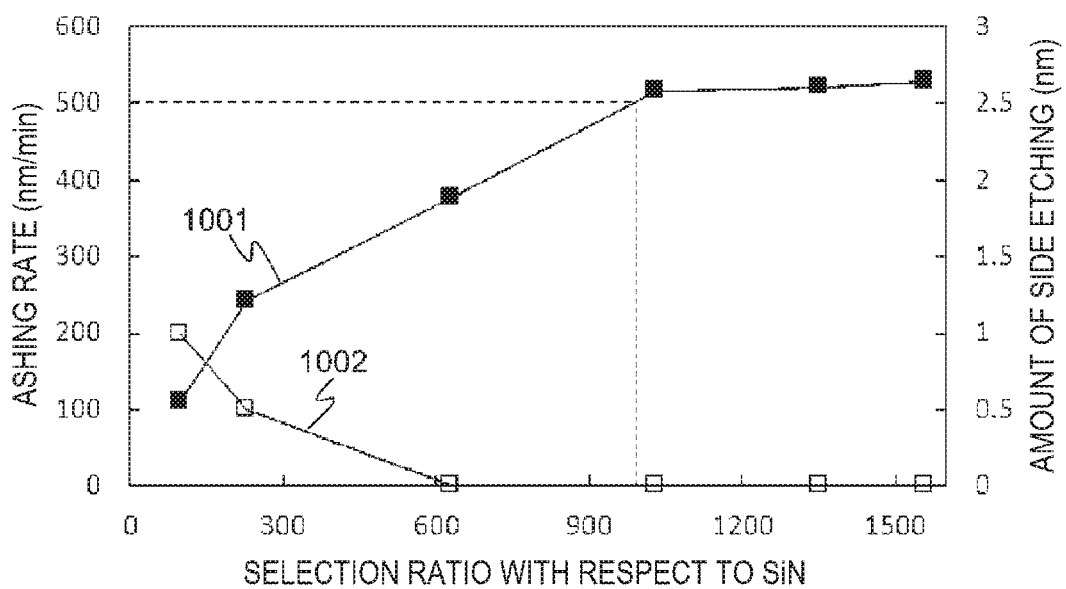

[FIG. 11]
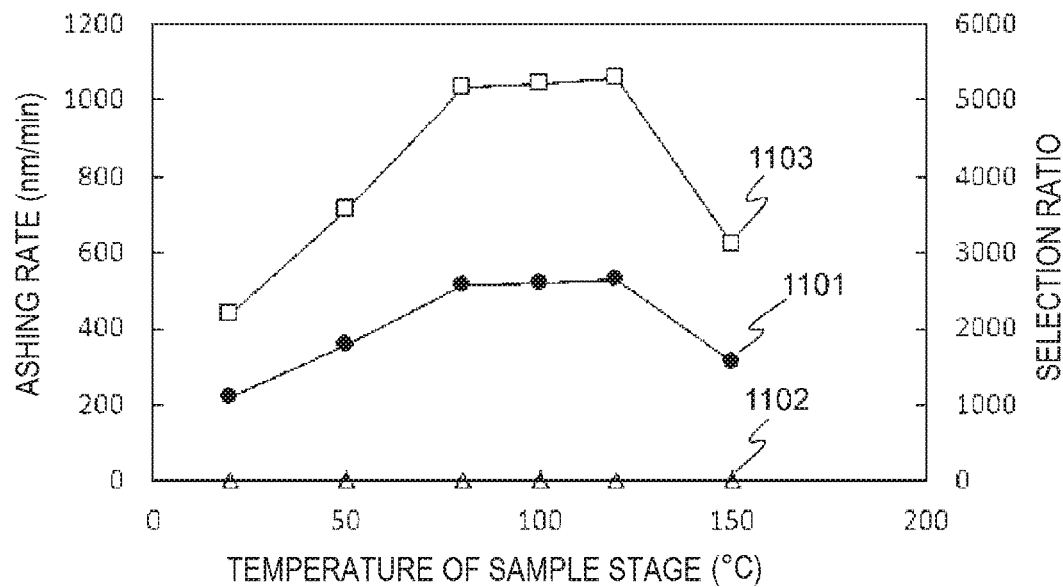
[FIG. 12]
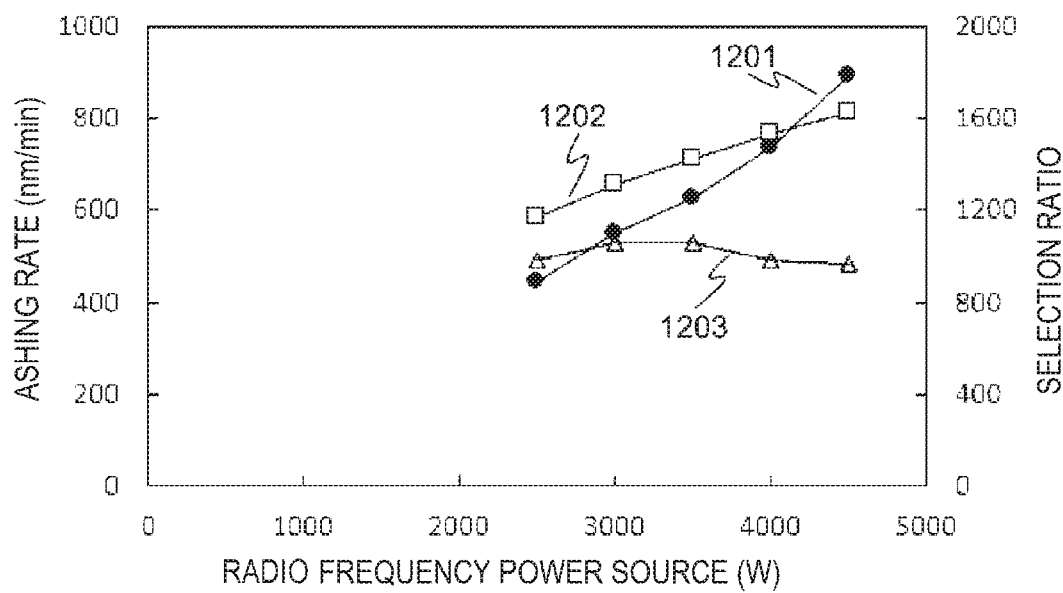

[FIG. 13]
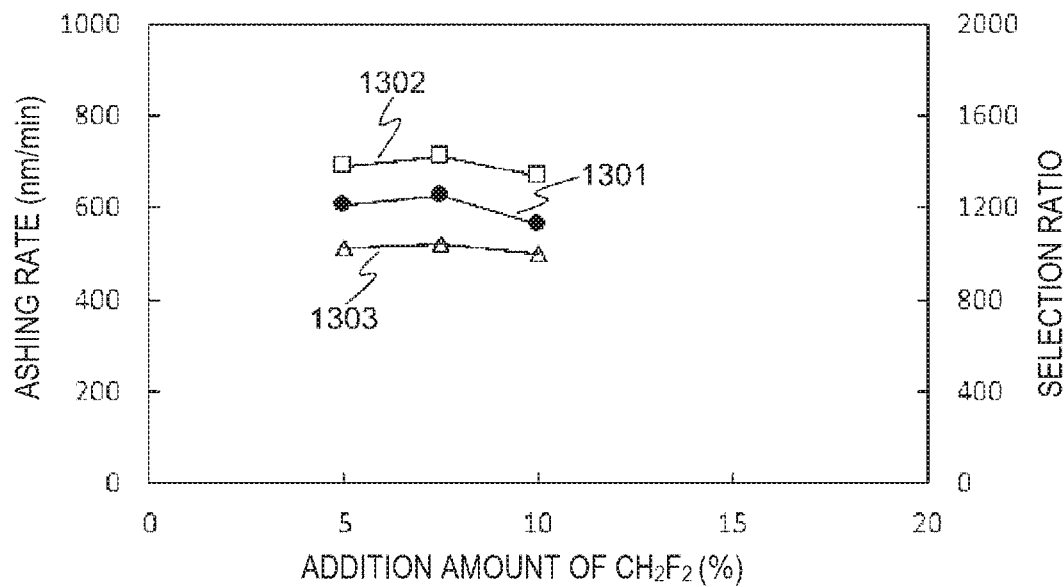
[FIG. 14]
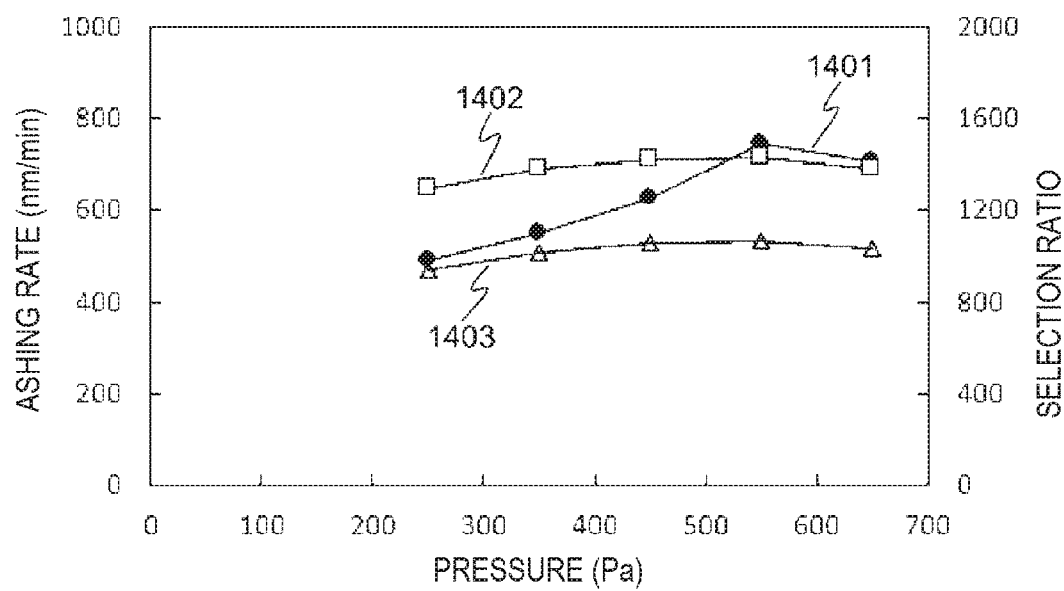

PLASMA PROCESSING METHOD AND PLASMA ASHING APPARATUS

TECHNICAL FIELD

The present invention relates to a method of manufacturing a semiconductor manufacturing apparatus and a semiconductor manufacturing apparatus, and particularly to an ashing processing for removing an organic film using plasma and an ashing processing apparatus.

BACKGROUND ART

In recent years, in a NAND flash memory technology of a semiconductor manufacturer, in order to achieve a higher degree of integration while preventing interference (crosstalk) between memory cells with miniaturization and reducing manufacturing cost, a three-dimensional NAND flash memory (3D-NAND) is adopted in which memory cells are stacked vertically.

An example of manufacturing steps includes a plasma etching step of taking a pattern of an amorphous carbon film (ACL) as a mask and forming a trench (etching groove) by anisotropic etching of plasma etching on a silicon substrate having a stacked film of 48 layers or more in which a silicon oxide film ($SiO_2$) and a silicon nitride film (SiN) are alternately stacked, and an ashing step of removing the amorphous carbon film using plasma after the plasma etching.

In a next generation and subsequent plasma etching technology for the three-dimensional NAND flash memory, the number of stacked layers of the silicon oxide film ($SiO_2$) and the silicon nitride film (SiN) increases to 96 or 128, and thus there is a concern that the film thickness of the mask will be insufficient during etching on the silicon substrate using the amorphous carbon film as a mask material. Therefore, a mask material using a boron-containing amorphous carbon film is developed as a new mask material, and etching on the silicon substrate using this mask material as well as ashing processing of removing this mask material using plasma is also developed.

In this ashing processing, although the amorphous carbon film in the related art can be easily removed with oxygen ($O_2$) gas, removal of the boron-containing amorphous carbon film with oxygen is difficult. Therefore, Patent Literature 1 discloses a method of plasma ashing an amorphous carbon film containing boron or nitrogen that is disposed on a stacked film of $SiO_2$ and SiN having the number of stacked layers of 15 to 25 using mixed gas of $O_2$ gas, $H_2$ gas and $CF_4$ gas.

PRIOR ART LITERATURE

Patent Literature

[Patent Literature 1] JP-T-2016-517179

SUMMARY OF THE INVENTION

Problem to be Solved by the Invention

In recent years, since the number of stacked layers of the stacked film, in which the silicon oxide film ($SiO_2$) and the silicon nitride film (SiN) are alternately stacked, increases to 96 or 126 with high integration in the three-dimensional NAND flash memory, the film thickness of the boron-containing amorphous carbon film also increases, and the processing time of ashing after etching becomes long.

When the boron-containing amorphous carbon film disposed above the stacked film having the number of stacked layers of 96 or more is asked using the ashing method disclosed in Patent Literature 1, there is a problem of side etching of $SiO_2$ or SiN in a side wall of a trench due to the increase in processing time of ashing and an insufficient selection ratio.

Therefore, an object of the invention is to provide, in plasma ashing processing of removing a boron-containing amorphous carbon film with plasma, a plasma processing method and a plasma asking apparatus capable of improving the removal rate of the boron-containing amorphous carbon film and preventing side etching of a side wall layer of a trench.

Means for Solving the Problem

To solve the above problems, the invention provides a representative plasma processing method for selectively removing, after plasma etching using a mask having an amorphous carbon film containing boron, the amorphous carbon film using plasma from a silicon nitride film, a silicon oxide film or a tungsten film. The method includes a removing step of removing the amorphous carbon film using plasma generated by mixed gas of $O_2$ gas and $CH_3F$ gas.

In addition, the invention provides another representative plasma processing method for selectively removing, after plasma etching using a mask having an amorphous carbon film containing boron, the amorphous carbon film using plasma from a silicon nitride film or a silicon oxide film. The method includes a removing step of removing the amorphous carbon film using plasma generated by mixed gas of $O_2$ gas and $CH_2F_2$ gas.

Further, the invention provides a representative plasma processing apparatus that includes: a processing chamber in which a sample is asked using plasma; a radio frequency power source configured to supply radio frequency power to generate the plasma; a gas supply mechanism configured to supply gas for the ashing; a pressure switch configured to detect that pressure in the processing chamber is equal to or less than a predetermined pressure; and a blocking mechanism configured to block supply of the gas and supply of the radio frequency power based on a detection result of the pressure switch. The predetermined pressure is equal to or less than 1000 Pa.

Advantage of the Invention

According to the invention, in the plasma ashing processing of removing the boron-containing amorphous carbon film with plasma, it is possible to provide a plasma processing method and a plasma ashing apparatus capable of improving the removal rate of the boron-containing amorphous carbon film and preventing side etching of the side wall layer of the trench.

Problems, configurations, and effects other than those described above will be apparent from the following description of embodiments.

BRIEF DESCRIPTION OF THE DRAWINGS

FIG. 1 is a schematic view of a plasma ashing apparatus according to an embodiment.

FIG. 2A is a cross-sectional view of a wafer before plasma ashing.

FIG. 2B is a cross-sectional view of the wafer after plasma ashing under conditions shown in Table 1.

FIG. 2C is a cross-sectional view of the wafer after plasma ashing under conditions shown in Table 2.

FIG. 3 is a flowchart showing a plasma processing method according to the present embodiment.

FIG. 4A shows changes of a ratio of emission intensity of OH (309 nm) to emission intensity of CO (451 nm) with time.

FIG. 4B shows changes of the emission intensity of OH (309 nm) with time.

FIG. 5 shows dependence of ashing rate and selection ratio on temperature of a sample stage.

FIG. 6 shows a relationship between temperature of the wafer and the temperature of the sample stage.

FIG. 7 shows dependency of the ashing rate and the selection ratio on an addition amount of $CH_3F$ gas.

FIG. 8 shows dependency of the ashing rate and the selection ratio on pressure.

FIG. 9 shows dependency of the ashing rate and the selection ratio on a flow rate of mixed gas of $O_2$ gas and $CH_3F$ gas.

FIG. 10 shows dependence of the ashing rate and an amount of side etching on a selection ratio with respect to SiN.

FIG. 11 shows dependence of ashing rate and selection ratio on temperature of a sample stage.

FIG. 12 shows dependency of the ashing rate and the selection ratio on a radio frequency power source.

FIG. 13 shows dependency of the ashing rate and the selection ratio on a flow rate of mixed gas of $O_2$ gas and $CH_2F_2$ gas.

FIG. 14 shows dependency of the ashing rate and the selection ratio on pressure.

MODE FOR CARRYING OUT THE INVENTION

First Embodiment

FIG. 1 is a schematic view showing a plasma ashing apparatus used in the present embodiment that is equipped with a downflow inductively coupled plasma source. A vacuum processing chamber includes a gas supply plate 101, a quartz chamber 102, and a chamber 103. The gas supply plate 101, which is a gas supply mechanism, includes a gas supply port to introduce processing gas from a gas source (not shown) and a dispersion plate 104 directly below the gas supply port to efficiently disperse the processing gas into outer peripheries in the quartz chamber 102.

The quartz chamber 102 is a cylindrical quartz chamber, and an induction coil 105 is wound around outer peripheries of the quartz chamber 102 at equal intervals. A current with a frequency of 27.12 MHz is supplied from a radio frequency power source 109 to the induction coil 105 so that the induction coil 105 generates an induction magnetic field. A radio frequency matching unit 110 is disposed between the radio frequency power source 109 and the induction coil 105. The radio frequency matching unit 110 can generate plasma efficiently even when a gas system or a processing material is changed. In the present embodiment, although a radio frequency current of 27.12 MHz flows in the induction coil 105, it is also possible to supply a radio frequency current of another frequency band, for example, 13.56 MHz, by selecting an appropriate radio frequency current set in the radio frequency matching unit 110.

The processing gas supplied into the chamber 103, which is a processing chamber, is exhausted by a pressure regulating valve 111 having a feedback function and a dry pump (not shown) so that pressure (referred to as processing pressure) in the chamber 103 can be set to a predetermined pressure. A wafer 107 placed on a sample stage 106, to which a temperature regulator 108 is connected, is asked by plasma generated in the quartz chamber 102.

During ashing, an endpoint of removal of a mask material can be detected by monitoring changes of emission intensity of reaction products emitted from the wafer 107 serving as a sample and from the processing gas with time by a spectroscope 112. In the present embodiment, the aluminum chamber 103 is used to reduce the cost of the apparatus. However, when a corrosive gas is used, it is desirable to use a material resistant to corrosion, for example, an aluminum chamber having an alumite surface.

Processing gas and the reaction product generated by ashing are exhausted from an exhaust port 113 by the dry pump (not shown). A detachable cover 114 is provided on an inner side of the chamber 103 to prevent the reaction product from adhering to the inner side of the chamber 103. Therefore, during the maintenance of the plasma ashing apparatus, it is possible to reduce downtime of the plasma ashing apparatus by replacing the cover 114 and taking out the removed cover for cleaning.

A combustion abatement apparatus is provided downstream the dry pump (not shown), so that combustible gas can be safely abated even if a large amount thereof is used. The plasma ashing apparatus further includes a pressure switch 115 that detects whether the processing pressure is equal to or less than a predetermined pressure up to 1000 Pa, so as not to exceed an explosion limit of the combustible gas. Therefore, the plasma ashing apparatus includes, when the pressure switch 115 exceeds the predetermined pressure due to some abnormality, a soft interlock or a hard interlock (blocking mechanism) that blocks a gas valve 116, the radio frequency power source 109, and the like immediately. By providing such a function, it is possible to safely perform the plasma ashing processing using mixed gas of oxygen gas, which is combustion supporting gas, and combustible gas.

Next, a method of plasma ashing a wafer in FIG. 2A, which has a stacked film (96 layers or more) in which a silicon oxide film 203 and a silicon nitride film 202 are alternately stacked and is etched with a boron-containing amorphous carbon film 204 as a mask, using the above plasma ashing apparatus will be described. As shown in FIG. 2A, the stacked film (96 layers or more) is disposed on a silicon 201. A content rate of boron of the boron-containing amorphous carbon film 204 is 50% or more so as to improve the selection ratio in the etching step.

TABLE 1

| Step | $O_2$ | $H_2$ | $CF_4$ | Processing Pressure | Radio frequency Power Source | Temperature of Sample Stage | Processing Time | Ashing Rate (nm/min) | | | Selection Ratio with respect to SiN | Selection Ratio with respect to $SiO_2$ |
|---|---|---|---|---|---|---|---|---|---|---|---|---|
| | (L/min) | | | (Pa) | (W) | (° C.) | (s) | B-ACL | SiN | $SiO_2$ | | |
| 1 | 10 | 0.6 | 0.3 | 250 | 0 | 20 | 25 | 510 | 1.7 | 0.7 | 300 | 729 |
| 2 | 10 | 0.6 | 0.3 | 250 | 4500 | 20 | 310 | | | | | |

First, FIG. 2B shows the shape of the wafer in FIG. 2A when the boron-containing amorphous carbon film 204 is asked under conditions in the related art in Table 1. The conditions in Table 1 includes step 1 of placing the wafer in FIG. 2A on the sample stage 106 and stabilizing the temperature of the wafer placed on the sample stage (processing time: 25 seconds), and step 2 of ashing the boron-containing amorphous carbon film (processing time: 310 seconds). Furthermore, "B-ACL" in Table 1 refers to "boron-containing amorphous carbon film".

As shown in FIG. 2B, during ashing based on the conditions in the related art, side etching 205 of 2 nm is generated to the silicon nitride film 202 on a side wall layer of a trench. It is considered that an insufficient selection ratio with respect to SiN, which is a ratio of the ashing rate of the boron-containing amorphous carbon film to the ashing rate of a SiN film wafer, is a main reason of the side etching 205. On the other hand, the silicon oxide film 203 is less likely to be etched by F radical than the silicon nitride film 202, so a selection ratio with respect to $SiO_2$ is sufficient and no side etching is generated. The selection ratio with respect to $SiO_2$ is a ratio of the ashing rate of the boron-containing amorphous carbon film to the ashing rate of a $SiO_2$ film wafer.

For this reason, in order to reduce the side etching to a silicon nitride film, it is necessary to increase the selection ratio with respect to SiN. Since the selection ratio with respect to SiN under the conditions in the related art shown in Table 1 or in Patent Literature 1 is about 300, which can be said necessary for ashing the boron-containing amorphous carbon film 204 on the stacked film of 96 layers or more in which the silicon oxide film 203 and the silicon nitride film 202 are alternately stacked. However, the selection ratio with respect to SiN is generally decreased in a case of F-based gas which is added to the plasma via the oxygen gas to increase the ashing rate. Accordingly, under the conditions in the related art shown in Table 1, it is difficult to realize the selection ratio with respect to SiN of 300 or more and the ashing rate of the boron-containing amorphous carbon film of 500 nm/min or more at the same time.

As shown in FIG. 2C, under the plasma processing conditions shown in Table 2, it is considered that the reason of the amount of the side etching to the side wall layers of the trenches of the SiN 202 and the $SiO_2$ 203 being 0 nm is that the selection ratio with respect to SiN is 629 under the conditions in Table 2. As a result, it can be seen that the standard of the selection ratio with respect to SiN necessary for preventing the side etching to the SiN 202 of the stacked film of 96 layers or more is about 600 or more.

Next, FIG. 3 shows a flow for ensuring the stability of the plasma processing method according to the present embodiment in mass production processing. First, before the ashing processing of the wafer, a temperature stabilization step (S301) is performed by discharging in an Ar gas atmosphere in the chamber 103 for 300 s to 600 s. Next, a wafer loading step (S302) is performed by transferring the wafer into the chamber 103 and placing the wafer on the sample stage 106. Further, a wafer temperature stabilization step (S303) is performed for a processing time of 25 seconds to stabilize the temperature of the wafer placed on the sample stage 106.

Then, a first ashing step (S304) of ashing the boron-containing amorphous carbon film 204 and determining an end point of the ashing processing, as well as a second ashing step (S305) of additionally ashing the boron-containing amorphous carbon film 204, is performed. Further, a wafer unloading step (S306) is performed by unloading the wafer after ashing from the chamber 103. When the ashing processing is continuously performed on the wafer, in order to perform a continuous processing step (S307), the flow is returned to the wafer loading step (S302) and a new wafer is transferred.

The first ashing step and the second ashing step constitute a removing step. The temperature stabilization step (stabilization step) is performed before the removing step by setting the temperature of the sample stage to be the same as that in the removing step while mixed gas of $O_2$ gas and $CH_3F$ gas is supplied into the chamber. Plasma is not generated in the stabilization step.

TABLE 2

| | | | | | | | | | Selection Ratio | |
| | | | | | | | | | | |
| | $O_2$ | $CH_3F$ | Processing Pressure | Radio frequency Power Source | Temperature of Sample Stage | Processing Time | Ashing Rate (nm/min) | | with respect to SiN | with respect to $SiO_2$ |
| Step | (L/min) | | (Pa) | (W) | (° C.) | (s) | B-ACL | SiN | $SiO_2$ | | |
| 1 | 10 | 0.75 | 450 | 0 | 100 | 25 | 377 | 0.6 | 0.2 | 629 | 1885 |
| 2 | 10 | 0.75 | 450 | 4500 | 100 | 420 | | | | | |

Next, FIG. 2C shows the shape of the wafer shown in FIG. 2A when the boron-containing amorphous carbon film 204 is asked under the conditions of Table 2 according to the plasma processing method of the present embodiment.

As shown in FIG. 2C, an amount of side etching to side wall layers of trenches of SiN 202 and $SiO_2$ 203 can be made 0 nm.

Furthermore, the plasma processing method according to the present embodiment in Table 2 includes step 1 of placing the wafer shown in FIG. 2A on the sample stage 106 and stabilizing the temperature of the wafer placed on the sample stage (processing time: 25 seconds), and step 2 of asking the boron-containing amorphous carbon film (processing time: 420 seconds). "B-ACL" in Table 2 refers to "boron-containing amorphous carbon film".

By performing the flow shown in FIG. 3, the quartz chamber 102 can be heated by the temperature stabilization step (S301), and the changes of the ashing rate during continuous processing with time can be reduced. Further, it is possible to detect the end point of the ashing processing of the stable mask material in the second ashing step.

The end point determination processing in the first ashing step (S304) is performed by using the changes of an emission intensity ratio with time based on the detection of the spectroscope 112. In FIG. 4A, the changes of the emission intensity shows the changes of the ratio of emission intensity of OH (309 nm) to emission intensity of a reaction product CO (451 nm) with time. Here, in FIG. 4A, a reference numeral 401 indicates an end point of a Cell portion, and a reference numeral 402 indicates an end point of a peripheral portion.

Changes in the Cell and of peripheral circuit portion are emphasized as determination (end of removal of the amorphous carbon film) of the end point of the processing in the first ashing step (S304) by using the changes of the emission intensity ratio with time as shown in FIG. 4A comparing with using the changes of the emission intensity of OH alone with time (FIG. 4B). Therefore, it is possible to improve the determination accuracy of determining the end point of the processing of the first ashing step (S304).

As a result, it is possible to absorb film formation conditions and processing variations of etching in the previous step, and achieve a stable removal performance of the boron-containing amorphous carbon film even in a case of changes of the apparatus itself with time and the machine difference. Furthermore, the shape shown in FIG. 2C according to the present embodiment is a result of ashing processing with an over-ashing rate of 100% with respect to the end point 402 of the peripheral portion.

Next, results of the margin examination of ashing processing conditions of the boron-containing amorphous carbon film are shown below. In order to examine the difference between $CF_4$ gas and $CH_3F$ gas, conditions and results changed from $CF_4$ gas to $CH_3F$ gas with respect to the conditions in the related art shown in Table 1 are shown in Table 3.

numeral 501) monotonically increases in the range of 20° C. to 120° C., the temperature of the sample stage reaches saturated temperature in the range of 80° C. to 120° C., the temperature of the sample stage reaches a maximum value at 120° C., and the temperature of the sample stage 106 tends to decrease in the range of 120° C. to 150° C. Similarly, the selection ratio with respect to $SiO_2$ (indicated by reference numeral 502) and the selection ratio with respect to SiN (indicated by reference numeral 503) also increase when the temperature of the sample stage 106 is in the range of 20° C. to 120° C. The temperature of the sample stage reaches saturated temperature in the range of 80° C. to 120° C., the temperature of the sample stage reaches a maximum value at 120° C., and the temperature of the sample stage 106 tends to decrease in the range of 120° C. to 150° C.

As described above, the ashing rate of the boron-containing amorphous carbon film tends to increase when the temperature of the sample stage 106 is in the range of 20° C. to 120° C. Accordingly, when the temperature of the wafer rises, it is considered that the boron-containing amorphous carbon film is asked by oxidation of carbon and fluorination of boron on a surface of the boron-containing amorphous carbon film. The reason that the ashing rate of the boron-containing amorphous carbon film tends to decrease when the temperature of the sample stage 106 is in the range of

TABLE 3

| Step | $O_2$ (L/min) | $H_2$ (L/min) | $CH_3F$ (L/min) | Processing Pressure (Pa) | Radio frequency Power Source (W) | Temperature of Sample Stage (° C.) | Processing Time (s) | Ashing Rate (nm/min) B-ACL | Ashing Rate (nm/min) SiN | Ashing Rate (nm/min) $SiO_2$ | Selection Ratio with respect to SiN | Selection Ratio with respect to $SiO_2$ |
|---|---|---|---|---|---|---|---|---|---|---|---|---|
| 1 | 10 | 0.6 | 0.3 | 250 | 0 | 20 | 25 | 186 | 1.5 | 0.5 | 124 | 372 |
| 2 | 10 | 0.6 | 0.3 | 250 | 4500 | 20 | 850 | | | | | |

In the ashing processing under the conditions shown in Table 3, the selection ratio with respect to SiN is 124, which is lower than the selection ratio with respect to SiN under the conditions of Table 1. However, the amount of side etching to the silicon nitride film 202 is 1 nm, which is smaller compared with the case where the ashing processing is performed under the conditions of Table 1. As a result, it is considered that, since a CH-based deposit, which is a reaction product of a boron-containing amorphous carbon film and $CH_3F$ gas, adheres to the side wall layer of the trench, the ashing rate of the side wall layer of the trench of the silicon nitride film 202 is reduced.

From the above results, in order to ash the boron-containing amorphous carbon film while reducing the side etching to the silicon nitride film, it is found that, among CHxFy gases which generate CHx deposit and the F radical which is etchant of boron, $CH_3F$ gas having a small F ratio and a large hydrogen ratio is the most suitable gas as a fluorine-containing gas to be added to the $O_2$ gas in terms of selection ratio. The same effect can be obtained by using $CH_2F_2$ gas.

Next, FIG. 5 shows the results of examining the dependence of the ashing rate and the selection ratio on the temperature of the sample stage 106 in the gas system shown in Table 2. As the ashing processing conditions, the flow rate of 02 gas is set to 10 L/min, the flow rate of $CH_3F$ gas is set to 0.75 L/min, processing pressure is set to 450 Pa, and output of radio frequency power source is set to 4500 W.

As shown in FIG. 5, the ashing rate of the boron-containing amorphous carbon film (indicated by reference 120° C. to 150° C. is considered to be that oxidation of boron becomes predominant and the reaction with F radical is reduced.

The reason that the selection ratio with respect to $SiO_2$ (indicated by reference numeral 502) and the selection ratio with respect to SiN (indicated by reference numeral 503) tends to increase when the temperature of the sample stage 106 is in the range of 20° C. to 120° C. is considered to be that oxidation on a surface of $SiO_2$ or on a surface of SiN is promoted as the wafer temperature rises, the ashing to the silicon oxide film and the silicon nitride film by F radical is reduced, and the ashing rate of the boron-containing amorphous carbon film increases when the temperature of the sample stage 106 is in the range of 20° C. to 120° C.

When the temperature of the sample stage 106 is 20° C. to 150° C., the mixed gas of $O_2$ gas and $CH_3F$ gas has a higher oxygen concentration on the surface of SiN than that of the mixed gas under the conditions in the related art shown in Table 1. Therefore, it is considered that the mixed gas of $O_2$ gas and $CH_3F$ gas is more effective than the mixed gas in the related art for promoting oxidation on a surface of the SiN wafer.

From the above, in the ashing of a boron-containing amorphous carbon film using plasma by the mixed gas of $O_2$ gas and $CH_3F$ gas, it is desirable that the temperature of the sample stage 106 is 80° C. to 120° C. in terms of improving the ashing rate and the selection ratio.

Generally, in the plasma ashing apparatus, an electrostatic adsorption mechanism such as an etching apparatus is often not used on the sample stage 106 to reduce the price, and a set temperature of the sample stage 106 and the temperature of the wafer are different. As an example, FIG. 6 shows the results of examining the relationship between the temperature of the wafer and the set temperature of the sample stage 106. The temperature of the wafer is measured with a plurality of temperature sensors embedded in the wafer.

As a result of the measurement, as shown in FIG. 6, when the set temperature of the sample stage 106 is in the range of 80° C. to 120° C., the temperature of the wafer is 121° C. to 182° C. Therefore, in terms of improving the ashing rate and the selection ratio, it is considered that the same effect can be obtained when the temperature of the wafer is in the range of 121° C. to 182° C. and when the set temperature of the sample stage 106 is in the range of 80° C. to 120° C.

The temperature of the wafer changes depending on heat input from the plasma and a heat flow rate to the sample stage 106. Accordingly, it is necessary to appropriately adjust the set temperature of the sample stage 106 according to the heat contact structure of the sample stage 106 and the plasma conditions taking the temperature of the wafer as an index. In particular, when a sample stage is used, in which a wafer is electrostatically adsorbed to the sample stage 106 and He or the like is filled between the wafer and the sample stage, it is preferable to take the wafer temperature of 121° C. to 182° C. as a reference.

Next, FIG. 7 shows, when the temperature of the sample stage 106 is set to 20° C., the flow rate of 02 gas is set to 10 L/min, the flow rate of $CH_3F$ gas is set to 0.3 L/min to 1.5 L/min, the processing pressure is set to 250 Pa, and the output of the radio frequency power source is set to 4500 W, the relationship of the ashing rate of the boron-containing amorphous carbon film and the selection ratio with respect to an addition amount of $CH_3F$ gas to a total gas flow rate of the mixed gas of $O_2$ gas and $CH_3F$ gas.

As shown in FIG. 7, the ashing rate of the boron-containing amorphous carbon film (indicated by reference numeral 701) increases when the addition amount of $CH_3F$ gas to the total gas flow rate of the mixed gas of $O_2$ gas and $CH_3F$ gas is in the range of 5% to 12%, the ashing rate of the boron-containing amorphous carbon film (indicated by reference numeral 701) decreases when the addition amount of $CH_3F$ gas is in the range of 12% to 15%. The selection ratio with respect to $SiO_2$ (indicated by reference numeral 702) and the selection ratio with respect to SiN (indicated by reference numeral 703) increase when the addition amount of $CH_3F$ gas is in the range of 5% to 12%.

The reason for the increase in the ashing rate of the boron-containing amorphous carbon film when the addition amount of $CH_3F$ gas is in the range of 5% to 12% is considered to be that the boron-containing amorphous carbon film is asked by the reaction promoted by the increase of F radical which is etchant of boron. On the other hand, the reason for the decrease in the ashing rate of the boron-containing amorphous carbon film when the addition amount of $CH_3F$ gas is in the range of 12% to 15% is considered to be that the ashing is reduced by the increased CHx.

When the addition amount of $CH_3F$ gas increases, the CHx increases and the ashing rate of the silicon oxide film and the ashing rate of the silicon nitride film decrease. However, when the addition amount of $CH_3F$ gas is in the range of 12% to 15%, it is considered that the selection ratio decreases since the ashing rate of the boron-containing amorphous carbon film decreases. Therefore, it is desirable that the addition amount of $CH_3F$ gas to the total gas flow rate of the mixed gas of $O_2$ gas and $CH_3F$ gas is 5% to 12%. At this time, the ashing rate of the boron-containing amorphous carbon film is 135 nm/min to 145 nm/min and the selection ratio with respect to the silicon nitride film is about 168 to 186.

Next, FIG. 8 shows, when the temperature of the sample stage 106 is set to 20° C., the flow rate of 02 gas is set to 10 L/min, the flow rate of $CH_3F$ gas is set to 0.75 L/min, the processing pressure is set to 250 Pa to 650 Pa, and the output of the radio frequency power source is set to 4500 W, the relationship of the ashing rate of the boron-containing amorphous carbon film and the selection ratio with respect to the processing pressure.

As shown in FIG. 8, the ashing rate of the boron-containing amorphous carbon film (indicated by reference numeral 801) increases when the processing pressure is in the range of 250 Pa to 550 Pa and decreases at 650 Pa. The selection ratio with respect to $SiO_2$ (indicated by reference numeral 802) and the selection ratio with respect to SiN (indicated by reference numeral 803) increase when the processing pressure is in the range of 250 Pa to 550 Pa.

The reason for the increase in the ashing rate of the boron-containing amorphous carbon film when the processing pressure is in the range of 250 Pa to 550 Pa is considered to be that the boron-containing amorphous carbon film is asked by the reaction promoted by the increase of F radical which is etchant of boron. On the other hand, the reason for the decrease in ashing rate of the boron-containing amorphous carbon film when the processing pressure is 650 Pa is considered to be that the plasma dissociation is insufficient with respect to the processing pressure. When the processing pressure increases, the CHx increases and the ashing rate of the silicon oxide film and the ashing rate of the silicon nitride film decrease. However, when the processing pressure is 650 Pa, it is considered that the selection ratio decreases since the ashing rate of the boron-containing amorphous carbon film decreases.

Therefore, when a radio frequency power of about 4500 W is used, the processing pressure is desired to be 250 Pa to 450 Pa. At this time, the ashing rate of the boron-containing amorphous carbon film is 142 nm/min to 192 nm/min and the selection ratio with respect to the silicon nitride film is about 175 to 230. Furthermore, when the radio frequency power for plasma generation increases, the ashing rate increases as the processing pressure increases. However, when a mixed gas of combustible gas and combustion supporting gas is used as in the present embodiment, it is necessary to control the processing pressure to be equal to or less than the explosion limit of the combustible gas.

Next, FIG. 9 shows, when the temperature of the sample stage 106 is set to 100° C., the flow rate of 02 gas is set to 20 L/min, the flow rate of $CH_3F$ gas is set to 1.5 L/min, the processing pressure is set to 450 Pa, and the output of the radio frequency power source is set to 4500 W (Table 4), the relationship of the ashing rate and selection ratio with respect to the flow rate of the mixed gas of $O_2$ gas and $CH_3F$ gas.

As shown in FIG. 9, the ashing rate of the boron-containing amorphous carbon film (indicated by reference numeral 901) can reach 521 nm/min or more when the flow rate of the mixed gas of $O_2$ gas and $CH_3F$ gas increases. Similarly, the selection ratio with respect to $SiO_2$ (indicated by reference numeral 902) and the selection ratio with respect to SiN (indicated by reference numeral 903) also increase with the increase of the flow rate of the mixed gas of $O_2$ gas and $CH_3F$ gas. Furthermore, the "total gas flow rate" in FIG. 9 is the flow rate of the mixed gas of $O_2$ gas and $CH_3F$ gas.

The selection ratio with respect to SiN under the conditions shown in Table 4 is 1303, which is relatively high. Therefore, side etching is not generated on the side wall layer of the trench with respect to the silicon nitride film 202. Furthermore, with the above characteristic shown in FIG. 9, the total gas flow rate of the mixed gas of $O_2$ gas and $CH_3F$ gas is preferably 21.5 L/min or more for ashing the boron-containing amorphous carbon film as a mask of next generation in which etching to a stacked film of 96 layers or more of $SiO_2$ and SiN is required.

TABLE 4

| Step | $O_2$ (L/min) | $CH_3F$ (L/min) | Processing Pressure (Pa) | Radio frequency Power Source (W) | Temperature of Sample Stage (° C.) | Processing Time (s) | Ashing Rate (nm/min) B-ACL | SiN | $SiO_2$ | Selection Ratio with respect to SiN | Selection Ratio with respect to $SiO_2$ |
|---|---|---|---|---|---|---|---|---|---|---|---|
| 1 | 20 | 1.5 | 450 | 0 | 100 | 25 | 521 | 0.4 | 0.2 | 1303 | 2605 |
| 2 | 20 | 1.5 | 450 | 4500 | 100 | 420 | | | | | |

Next, FIG. 10 shows the relationship of the ashing rate of the boron-containing amorphous carbon film and the amount of side etching to the silicon nitride film with respect to the selection ratio with respect to SiN. FIG. 10 shows that, in the mixed gas of $O_2$ gas and $CH_3F$ gas, when the selection ratio with respect to SiN is 600 or more and when the amount of side etching to the silicon nitride film (indicated by reference numeral 1002) is 0 nm and the selection ratio with respect to SiN is 980 or more, the ashing rate of the boron-containing amorphous carbon film (indicated by reference numeral 1001) is 500 nm/min or more. Therefore, when the selection ratio with respect to SiN is 980 or more, the ashing rate of the boron-containing amorphous carbon film is 500 nm/min or more, and the side etching can be reduced.

When the temperature of the sample stage 106 is in the range of 80° C. to 120° C., the selection ratio with respect to SiN is 980 or more under conditions that the processing pressure is 250 Pa to 1000 Pa, a flow ratio of $CH_3F$ gas to mixed gas of $O_2$ gas and $CH_3F$ gas is 5% to 12%, and the flow rate of mixed gas of $O_2$ gas and $CH_3F$ gas is 21.5 L/min or more. Accordingly, the ashing rate of the boron-containing amorphous carbon film is 500 nm/min or more even under such conditions, and the side etching can be reduced.

Next, FIG. 11 shows, when the flow rate of 02 gas is 20 L/min, the flow rate of $CH_3F$ gas is 1.5 L/min, the processing pressure is 450 Pa, and the output of the radio frequency power source is 4500 W, the relationship of the ashing rate of the boron-containing amorphous carbon film and a tungsten film and the selection ratio with respect to the temperature of the sample stage 106.

As shown in FIG. 11, with the mixed gas of $O_2$ gas and $CH_3F$ gas, an ashing rate of the tungsten film (indicated by reference numeral 1102) is equal to or less than 0.1 nm/min with respect to the ashing rate of the boron-containing amorphous carbon film (indicated by reference numeral 1101) when the temperature of the sample stage 106 is in the range of 20° C. to 150° C. Therefore, a selection ratio with respect to the tungsten (W) film (indicated by reference numeral 1103) is as high as 2180 to 5280, which is a ratio of the ashing rate of the boron-containing amorphous carbon film to the ashing rate of the tungsten film.

Therefore, by ashing the boron-containing amorphous carbon film of the wafer in which the tungsten film is used as the side wall layer or a ground of the trench using plasma of the mixed gas of $O_2$ gas and $CH_3F$ gas, it is possible to ash the boron-containing amorphous carbon film at a high selection ratio with respect to the tungsten film.

The present embodiment describes the ashing processing of the boron-containing amorphous carbon film as the mask in a stacked structure having the SiN film, the $SiO_2$ film as the side wall layer of the trench and a Si as the ground. However, the same effect can be obtained as long as any one of the film is provided on the side wall layer or the ground of the trench.

Although the present embodiment describes an example in which an ashing apparatus of an inductively coupled plasma source is used, the same effect can also be obtained by an ashing apparatus using another plasma source such as plasma generated by a microwave.

As described above, according to the invention, in a plasma ashing method of removing the boron-containing amorphous carbon film with plasma, it is possible to improve the removal rate of the boron-containing amorphous carbon film and reduce side etching to the side wall layer of the trench, and mass production processing can be stably performed.

By ashing the boron-containing amorphous carbon film using plasma of mixed gas of $O_2$ gas and $CH_3F$ gas, the boron-containing amorphous carbon film can be asked at a high selection ratio with respect to the silicon nitride film, the silicon oxide film, or the tungsten film.

Second Embodiment

The second embodiment will be described below. In the present embodiment, $O_2$ gas and $CH_2F_2$ gas are supplied to a plasma ashing apparatus of FIG. 1, ashing processing is performed on a wafer having a stacked film (96 layers or more) shown in FIG. 2A according to the flow of FIG. 3. A content rate of boron in the boron-containing amorphous carbon film 204 is 50% or more in order to improve a selection ratio in an etching step. Unless otherwise specified, the same configurations and processing as those of the above embodiment are used, and redundant description will be omitted.

FIG. 12 shows, when temperature of the sample stage 106 is set to 100° C., the flow rate of 02 gas is set to 20 L/min, the flow rate of $CH_2F_2$ gas is set to 1.5 L/min, processing pressure is set to 450 Pa, and 2500 W to 4500 W is applied by a radio frequency power source, the relationship of an ashing rate of B-ACL and a selection ratio with respect to the radio frequency power source.

As shown in FIG. 12, the ashing rate of B-ACL (indicated by reference numeral 1201) and a selection ratio with respect to $SiO_2$ (indicated by reference numeral 1202) increases when output of the radio frequency power source is in the range of 2500 W to 4500 W. On the other hand, a selection ratio with respect to SiN (indicated by reference numeral 1203) increases when the output of the radio frequency power source is in the range of 2500 W to 3500 W, and decreases when the output of the radio frequency power source is in the range of 4000 W to 4500 W.

The reason for the increase in the ashing rate of B-ACL is considered to be that, when the output of the radio frequency power source is in the range of 2500 W to 4500 W, the reaction with B-ACL film is promoted by the increase of F radical which is an etchant.

On the other hand, the reason for the decrease in an ashing rate of a silicon nitride film when the output of the radio frequency power source is in the range of 4000 W to 4500 W is considered to be that, although the reaction is promoted by the increase of F radical and the ashing rate increases, the influence of the increase in F radical due to the increase in the radio frequency power is larger than that of the B-ACL film. Therefore, it is desirable that the output of the radio frequency power is in the range of 2500 W to 3500 W. At this time, the ashing rate of the B-ACL layer is 444 nm/min to 627 nm/min and selection ratio with respect to the silicon nitride film is about 987 to 1063.

FIG. 13 shows, when the temperature of the sample stage 106 is set to 20° C., the flow rate of 02 gas is set to 20 L/min, the flow rate of $CH_2F_2$ gas is set to 1.0 L/min to 2.0 L/min, processing pressure is set to 450 Pa, and 3500 W is applied by the radio frequency power source, the relationship of the ashing rate of B-ACL and selection ratio with respect to an addition amount of $CH_2F_2$ gas to a total gas flow rate of mixed gas of $O_2$ gas and $CH_2F_2$ gas.

The ashing rate of B-ACL (indicated by reference numeral 1301) increases when the addition amount of $CH_2F_2$ gas is in the range of 5% to 7.5%, and decreases when the addition amount of $CH_2F_2$ gas is in the range of 7.5% to 10%. The selection ratio with respect to $SiO_2$ (indicated by reference numeral 1302) and the selection ratio with respect to SiN (indicated by reference numeral 1303) also increase when the addition amount of $CH_2F_2$ gas is in the range of 5% to 7.5%.

The reason for the increase of the ashing rate is considered to be that the reaction is promoted by the increase of F radical which is the etchant of boron when the addition amount of $CH_2F_2$ gas is in the range of 5% to 7.5%, and the ashing is reduced when the addition amount of $CH_2F_2$ gas is in the range of 7.5% to 10%.

On the other hand, when the addition amount of $CH_2F_2$ gas increases, the CHx increases and the ashing rate of the silicon oxide film and the ashing rate of the silicon nitride film decrease. However, when the addition amount of $CH_2F_2$ gas is 7.5% to 10%, it is considered that the selection ratio decreases since the ashing rate of the B-ACL decreases. Therefore, it is desirable that the addition amount of $CH_2F_2$ gas is 5% to 7.5%. At this time, the ashing rate of the B-ACL film is 608 nm/min to 627 nm/min, and the selection ratio with respect to the silicon nitride film is about 1031 to 1045.

FIG. 14 shows, when the temperature of the sample stage 106 is set to 100° C., the flow rate of 02 gas is set to 20 L/min, the flow rate of $CH_2F_2$ gas is set to 1.5 L/min, the processing pressure is set to 250 Pa to 650 Pa, and 3500 W is applied by the radio frequency power source, the relationship of the ashing rate of the B-ACL and the selection ratio with respect to the processing pressure. The ashing rate of the B-ACL (indicated by reference numeral 1401) increases when the processing pressure is in the range of 250 Pa to 550 Pa, and decreases when the processing pressure is 650 Pa.

On the other hand, the selection ratio with respect to $SiO_2$ (indicated by reference numeral 1402) and the selection ratio with respect to SiN (indicated by reference numeral 1403) also increase when the processing pressure is in the range of 250 Pa to 550 Pa, and decrease when the processing pressure is 650 Pa. The reason for the increase in the ashing rate is considered to be that, when the processing pressure is in the range of 250 Pa to 550 Pa, the reaction with B-ACL film is promoted by the increase of F radical which is the etchant, and the reason for the decrease in ashing rate when the processing pressure is 650 Pa is considered to be that the plasma dissociation is insufficient with respect to the processing pressure.

When the processing pressure increases, the CHx increases and the ashing rate of the silicon oxide film and the ashing rate of the silicon nitride film decrease. However, when the processing pressure is 650 Pa, it is considered that the selection ratio also decreases since the ashing rate of B-ACL decreases.

Therefore, when the radio frequency power of about 3500 W is supplied, the processing pressure is desired to be 250 Pa to 550 Pa. At this time, the ashing rate of the B-ACL film is 492 nm/min to 746 nm/min and the selection ratio with respect to the silicon nitride film is about 946 to 1066.

TABLE 5

| Step | $O_2$ (L/min) | $CH_2F_3$ (L/min) | Processing Pressure (Pa) | Radio frequency Power Source (W) | Temperature of Sample Stage (° C.) | Processing Time (s) | Ashing Rate (nm/min) B-ACL | SiN | $SiO_2$ | Selection Ratio with respect to SiN | with respect to $SiO_2$ |
|---|---|---|---|---|---|---|---|---|---|---|---|
| 1 | 20 | 1.5 | 550 | 0 | 100 | 25 | 746 | 0.7 | 0.52 | 1066 | 1435 |
| 2 | 20 | 1.5 | 550 | 3500 | 100 | 293 | | | | | |

Under the conditions shown in Table 5, it is considered that, the selection ratio with respect to SiN is as high as 1066 and side etching to a side wall layer of a trench with respect to the silicon nitride film 202 is not generated. Accordingly, it is considered that the total gas flow rate of mixed gas of $O_2$ gas and $CH_2F_2$ gas of 21.5 L/min or more is effective for asking the B-ACL film of next generation.

The invention claimed is:

1. A plasma processing method for selectively plasma ashing an amorphous carbon film containing boron, to a film including a silicon nitride film, a silicon oxide film or a tungsten film, the method comprising:
providing the amorphous carbon film on the film; plasma etching the film using the amorphous carbon film as a mask to generate a plasma-etched film having a pattern; a stabilization step before a removing step, the stabilization step being performed by setting the temperature of the sample stage to be the same as that in the removing step while supplying a mixed gas of $O_2$ gas and $CH_3F$ gas into a processing chamber where the removing step is performed; and performing the removing step by selectively removing the amorphous carbon film from the plasma-etched film by plasma ashing using plasma generated by the mixed gas of $O_2$ gas and $CH_3F$ gas, wherein a content of the boron in the amorphous carbon film is 50% or more, and wherein the plasma ashing is performed when a temperature of a sample stage, on which the plasma-etched film from which the amorphous carbon film is ashed is placed, is set to 80° C. to 120° C.

2. The plasma processing method according to claim 1, wherein the plasma ashing is performed when a temperature of the plasma-etched film, from which the amorphous carbon film is ashed, is set to 121° C. to 182° C.

3. The plasma processing method according to claim 1, wherein in the plasma ashing, an end of plasma ashing of the amorphous carbon film is determined using a change of a value obtained by dividing an emission intensity of a wavelength indicating OH by an emission intensity of a wavelength indicating CO with time.

4. The plasma processing method according to claim 3, wherein the wavelength indicating OH is 309 nm, and the wavelength indicating CO is 451 nm.

5. The plasma processing method according to claim 1, wherein in the plasma ashing, processing pressure is set to be in a range of 250 Pa to 1000 Pa, a ratio of a flow rate of $CH_3F$ gas to a flow rate of the mixed gas is set to be in a range of 5% to 12%, and the flow rate of the mixed gas is set to be 21.5 L/min or more.

6. The plasma processing method according to claim 1, wherein the stabilization step is performed without generating plasma.

7. The plasma processing method according to claim 1, wherein a ratio of a flow rate of the $CH_3F$ gas to a flow rate of the mixed gas of the $O_2$ gas and the $CH_3F$ gas is a value in a range of 5% to 12%.

8. A plasma processing method for selectively plasma ashing an amorphous carbon film containing boron, to a film including a silicon nitride film or a silicon oxide film, the method comprising:

providing the amorphous carbon film on the film; plasma etching the film using the amorphous carbon film as a mask to generate a plasma-etched film having a pattern; a stabilization step before a removing step, the stabilization step being performed by setting the temperature of the sample stage to be the same as that in the removing step while supplying a mixed gas of $O_2$ gas and $CH_2F_2$ gas into a processing chamber where the removing step is performed; and performing the removing step by selectively removing the amorphous carbon film from the plasma-etched film by plasma ashing using plasma generated by the mixed gas of $O_2$ gas and $CH_2F_2$ gas, wherein a content of the boron in the amorphous carbon film is 50% or more, and wherein, in the plasma ashing, processing pressure is set to be in a range of 250 Pa to 550 Pa, and a ratio of a flow rate of $CH_2F_2$ gas to a flow rate of the mixed gas is set to be in a range of 5% to 7.5%.

9. The plasma processing method according to claim 8, wherein the plasma ashing is performed when a temperature of a sample stage, on which a sample from which the amorphous carbon film is ashed is placed, is set to 20° C. to 100° C.

10. The plasma processing method according to claim 8, wherein in the plasma ashing, a flow rate of the mixed gas is set to be 21.5 L/min or more.

11. The plasma processing method according to claim 9, wherein in the plasma ashing, a flow rate of the mixed gas is set to be 21.5 L/min or more.

\* \* \* \* \*